United States Patent [19]
Krause et al.

[11] Patent Number: 5,986,794
[45] Date of Patent: Nov. 16, 1999

[54] LASER OPTICS AND DIODE LASER

[75] Inventors: Volker Krause, Kufferbergstarasse 4; Christoph Ullmann, Pfarrer Hambuchenwega 11, both of Germany

[73] Assignee: Laserline Gesellschaft Fur Entwicklung und Vertrieb Von Diodenlasern MBH, Koblenz, Germany

[21] Appl. No.: 09/016,342

[22] Filed: Jan. 30, 1998

[30]      Foreign Application Priority Data

Feb. 1, 1997  [DE]  Germany ............................ 197 03 825
  Feb. 14, 1997 [DE]  Germany ............................ 197 05 574

[51] Int. Cl.$^6$ .................................................. G02B 26/08
[52] U.S. Cl. .......................... 359/222; 359/196; 359/896; 372/108
[58] Field of Search ...................... 359/222, 641, 359/642, 196, 838, 840, 850, 855–857, 896; 372/9, 108

[56]              References Cited
          U.S. PATENT DOCUMENTS 5,808,803   9/1998   Ullmann et al. ........................ 359/641

FOREIGN PATENT DOCUMENTS 195 14 625   10/1996   Germany .

*Primary Examiner*—James Phan
*Attorney, Agent, or Firm*—Hoffman, Wasson & Gitler

[57]                 ABSTRACT

The invention relates to novel laser optics for shaping at least one laser beam which has a linear or strip-shaped cross section which extends in the first axial direction (X-axis) perpendicular to the beam axis (Z-axis), with at least two optical shaping elements which are located in succession in the beam path, and of which at least one is an element through which a laser beam has passed, and which form an optical arrangement, in which at least one laser beam is fanned out in one plane (Y-Z plane) perpendicular to the first axis (X-axis) into several parallel component beams which are offset against one another both in the first axial direction (X-axis) and also in the second axial direction (Y-axis) which is perpendicular to the beam axis (Z-axis) and perpendicular to the first axis (X-axis), and in which then the fanned-out component beams are combined.

29 Claims, 5 Drawing Sheets

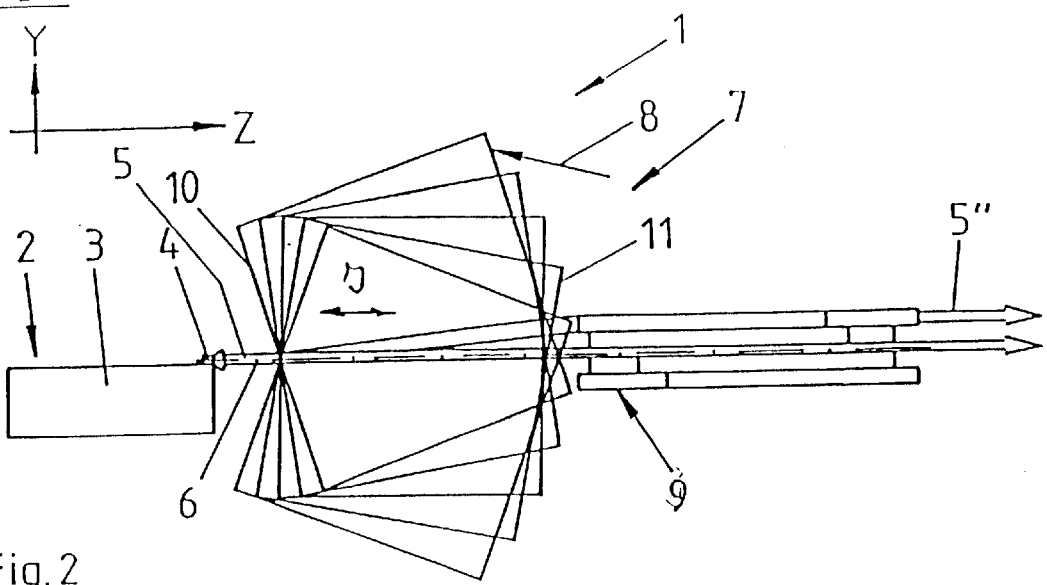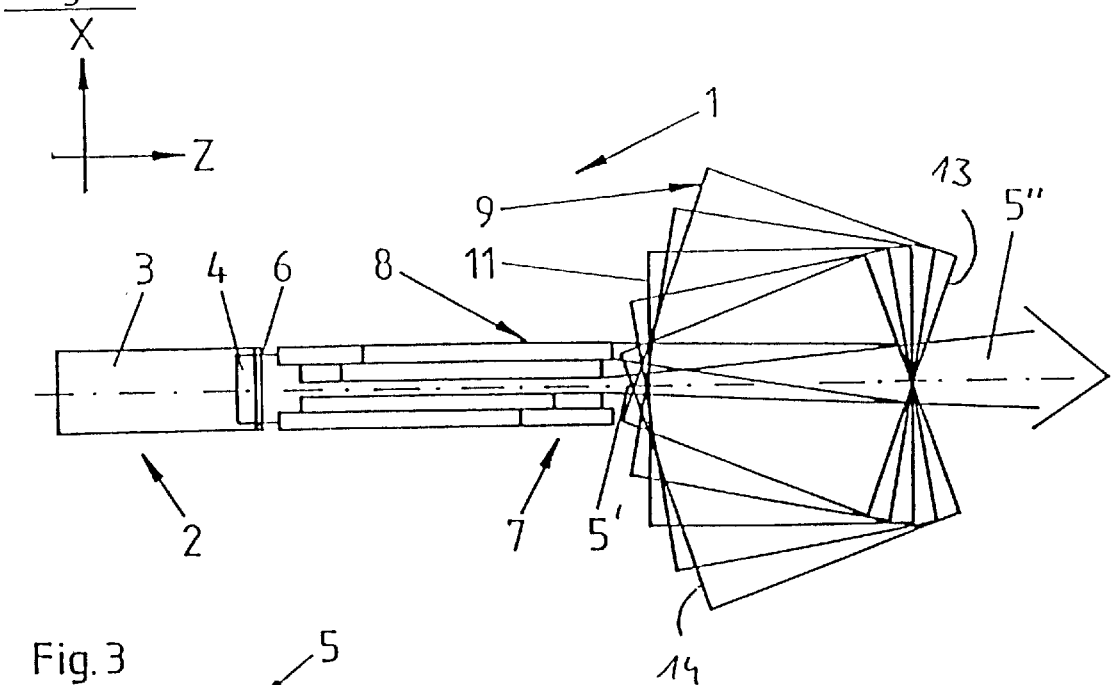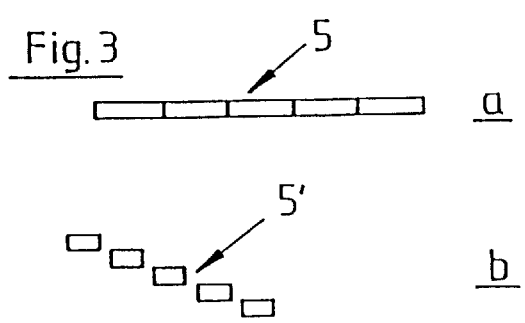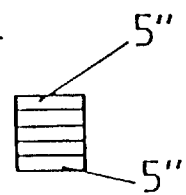

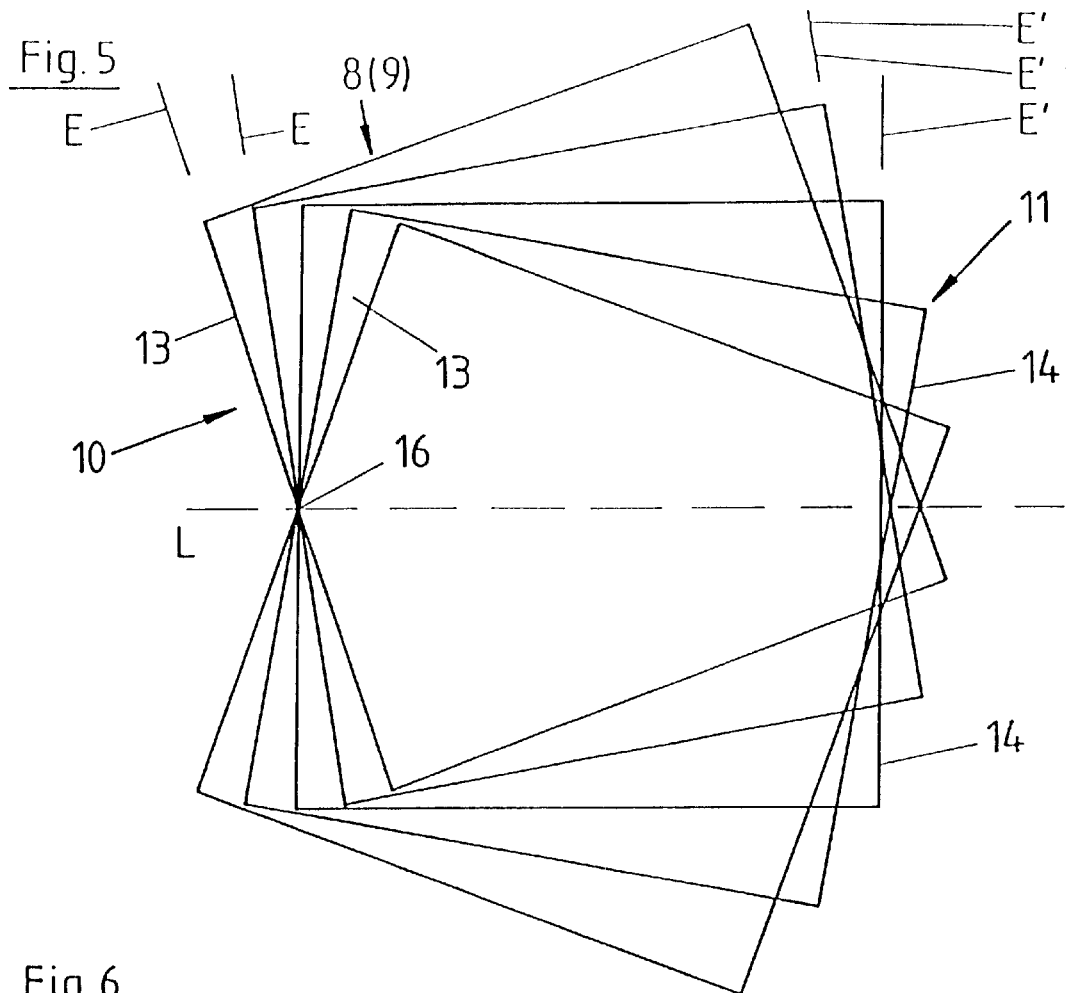
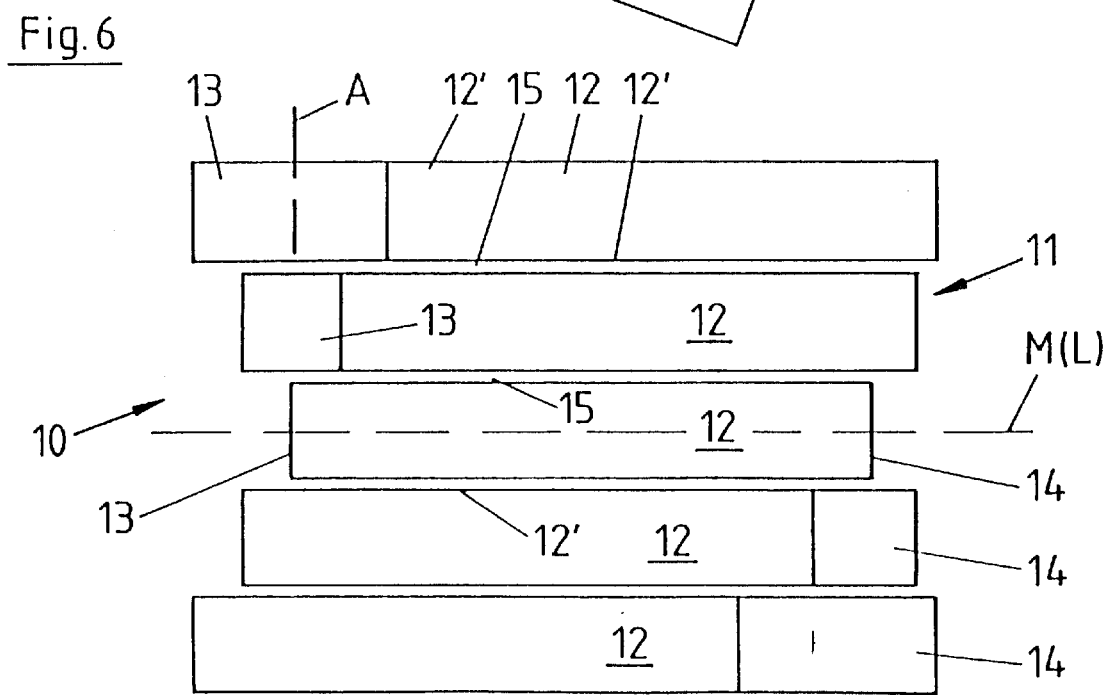

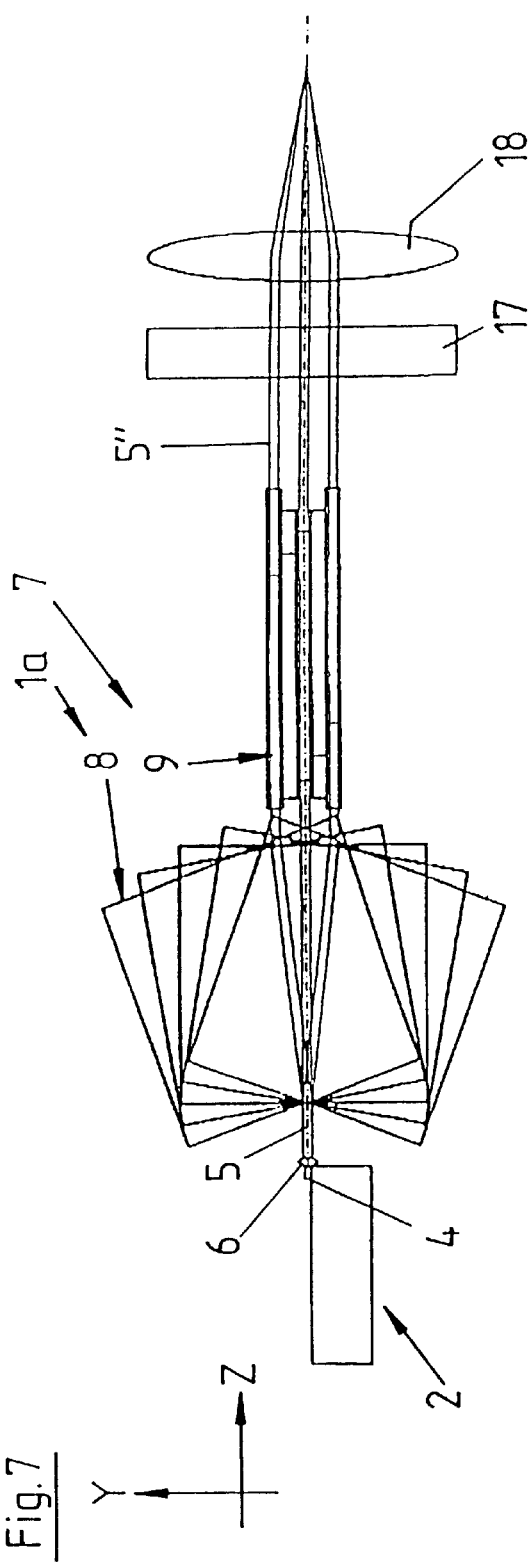
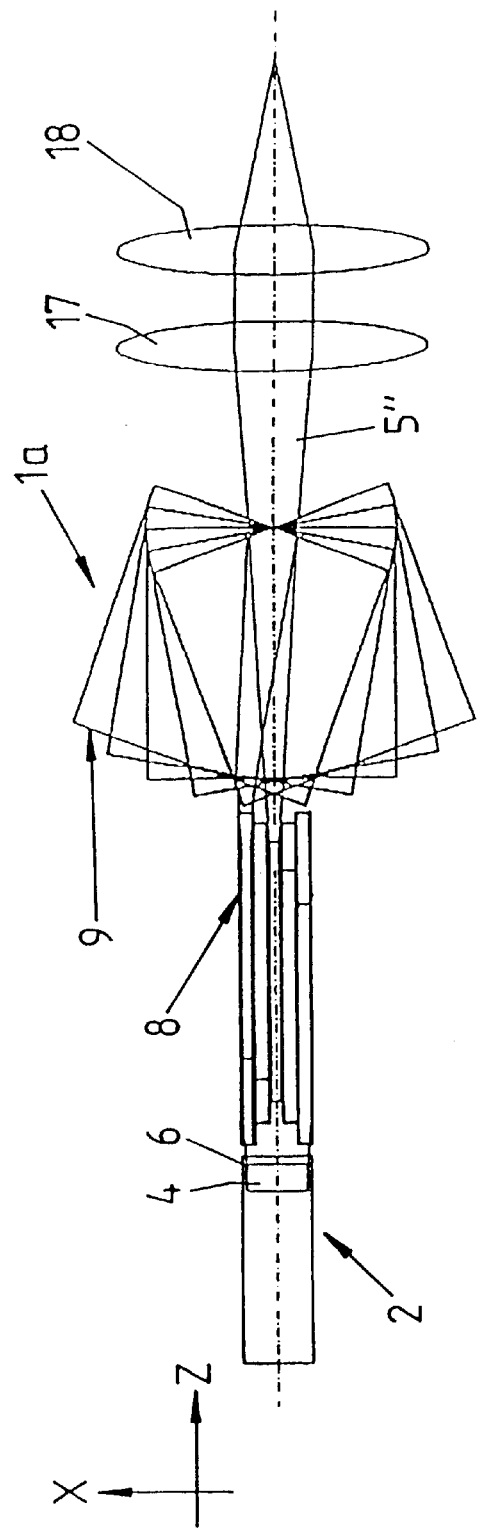

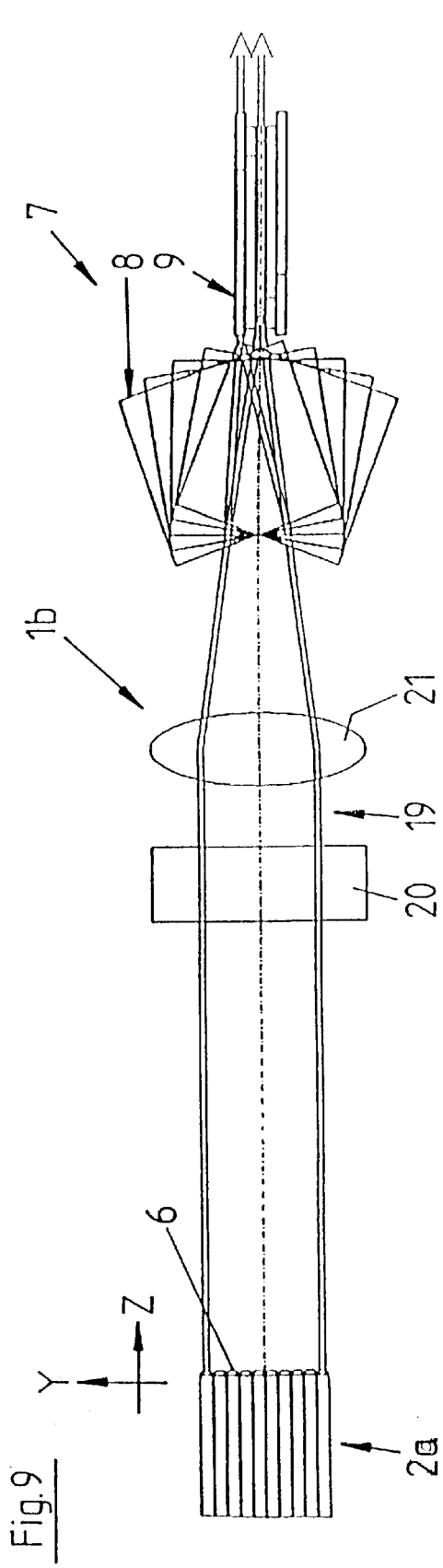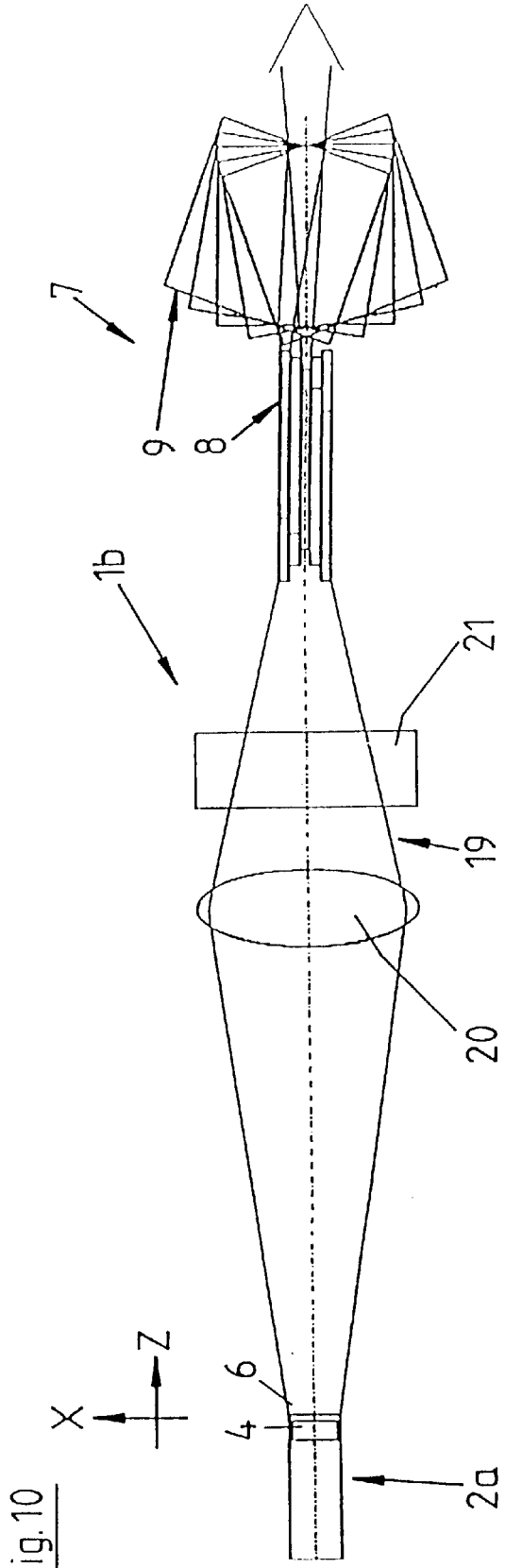
Fig.9
Fig.10

LASER OPTICS AND DIODE LASER

BACKGROUND OF THE INVENTION

The invention relates to laser optics and to a diode laser therewith.

In contrast to conventional laser beam sources which have a beam diameter of a few mm with low beam divergence in the range of a few mrad, the radiation of a semiconductor diode laser (hereinafter also "diode laser") is characterized by a highly divergent beam with a divergence >1000 mrad. This is caused by the exit layer which is limited to <1 micron in height, on which, like diffraction on a gap-shaped opening, a greater divergence angle is produced. Since the extension of the exit opening in the plane is different perpendicular and parallel to the active semiconductor layer, various beam divergences occur in the plane perpendicular and parallel to the active layer.

To achieve a power from 20 to 40 W for a diode laser, numerous laser chips are combined on a so-called bar to form a laser component. Conventionally 10–50 individual emitter groups are arranged in a row in the plane parallel to the active layer. The resulting beam of this bar in the plane parallel to the active angle has an opening angle of roughly 10° and a beam diameter of roughly 10 mm. The resulting beam quality in this plane is several times less than the resulting beam quality in the above described plane perpendicular to the active layer. In a possible further reduction of the divergence angle of laser chips the ratio of the beam quality perpendicular and parallel to the active layer differs greatly.

The beam has a major difference of beam quality in the two directions perpendicular and parallel to the active layer based on the above described beam characteristic. The concept of beam quality is described by the $M^2$ parameter. $M^2$ is defined by the factor with which the beam divergence of the diode laser beam exceeds the beam divergence of a diffraction-limited beam of the same diameter. In the aforementioned case, in the plane parallel to the active layer there is a beam diameter which exceeds the beam diameter in the vertical plane by a factor of 10 000. In beam divergence the behavior is somewhat different, i.e. in the plane parallel to the active layer beam divergence is less by almost a factor of 10. The $M^2$ parameter in the plane parallel to the active layer is thus several orders of magnitude above the $M^2$ value in the plane perpendicular to the active layer.

One possible objective of beam shaping is to achieve a beam with almost the same $M^2$ values in both planes, i.e. perpendicular and parallel to the active later. Currently the following methods are known for shaping the beam geometry, by which similarity of beam qualities in the two main planes of the beam is achieved.

By means of a fiber bundle linear beam cross sections can be combined to form a circular bundle by rearranging the fibers. These processes are described for example in U.S. Pat. Nos. 5,127,068; 4,763,975; 4,818,062; 5,268,978; and 5,258,989.

In addition, there is the technique of beam rotation in which the radiation of individual emitters is turned by 90° in order to undertake rearrangement, in which an arrangement of the beams in the direction of the axis of better beam quality takes place. The following arrangements for this process are known:

U.S. Pat. No. 5,168,401; EP 0 484 276; and DE 4 438 368. It is common to all processes that the radiation of a diode laser after its collimation in the fast axis direction is turned by 90° in order to effect slow axis collimation with common cylinder optics. In one modification of this process a continuous line source is also conceivable (for example, that of a diode laser of high occupation density which is collimated in the fast axis direction) with a beam profile (line) which is divided and which is present in rearranged form behind the optical element.

In addition, it is possible to undertake rearrangement of the radiation of individual emitters without rotating the beam, for example by parallel offset (shifting) by means of parallel mirrors rearrangement of the radiation being achieved (WO 95/15510). An arrangement which likewise uses the technique of rearrangement is described in DE 195 00 53 and DE 19 5 44 488. In this case the radiation of a diode laser bar is deflected into different planes and is individually collimated there.

The disadvantages of the prior art can be summarized among others in that for fiber-coupled diode lasers generally a beam with very different beam qualities in the two axial directions is coupled into the fiber. For a round fiber this means that in one axial direction the possible numerical aperture or fiber diameter is not used. This leads to major losses in power density so that in practice there is a limitation to roughly $10^4$ W/cm$^2$.

In these known processes, to some extent major path length differences must be furthermore compensated. This is generally done by correction prisms which can compensate for errors only to a limited degree. Multiple reflections furthermore impose increased demands for adjustment precision, production tolerances and component stability (WO 95/15510). Reflecting optics (for example, of copper) have high absorption values.

The object of the invention is to devise laser optics which avoid the aforementioned disadvantages, and with the possibility of simple and economical production enables reshaping of the laser beam in the desired manner.

SUMMARY OF THE INVENTION

The invention relates to novel laser optics for shaping at least one laser beam which has a linear or strip-shaped cross section which extends in the first axial direction (X-axis) perpendicular to the beam axis (Z-axis), with at least two optical shaping elements which are located in succession in the beam path, and of which at least one is an element through which a laser beam has passed, and which form an optical arrangement, in which at least one laser beam is fanned out in one plane (Y-Z plane) perpendicular to the first axis (X-axis) into several parallel component beams which are offset against one another both in the first axial direction (X-axis) and also in the second axial direction (Y-axis) which is perpendicular to the beam axis (Z-axis) and perpendicular to the first axis (X-axis), and in which then the fanned-out component beams are combined.

"Plate fan" in the sense of the invention is defined as an optical element through which laser light passes and which is composed of several plates or plate-shaped components of a light-guiding material, preferably glass, which adjoin one another in the manner of a stack and which are twisted against one another in the manner of a fan. Each plate or each plate-shaped element on opposite sides forms a narrow plate side for light entry or exit and is made such that total reflection takes place in the plate interior in the area of the surface sides.

"Surface sides" for the purposes of this invention are defined as the large plate sides. "Narrow sides" for the purposes of this invention are defined as the sides formed on the plate edge between the surface sides.

The plate fans can also be produced by combination from individual plates or plate-shaped elements or also in one piece, for example as a molding with the corresponding intermediate layers for total reflection.

With the shaping elements located in succession in the light path the laser beam is spread out into component beams located in different planes and subsequently these component beams are pushed on top of one another in the laser optics.

BRIEF DESCRIPTION OF THE DRAWINGS

The invention is detailed below using Figures on embodiments.

FIG. 1 shows in a simplified representation a diode laser consisting of a laser diode arrangement which has a plurality of laser elements or laser chips, and an optical arrangement formed in the beam path of this laser diode arrangement by two plate fans for shaping the laser beam, the plane of the drawing of this figure being perpendicular to the active layer of the diode element;

FIG. 2 shows the diode laser of FIG. 1, the plane of the drawing of this figure being parallel to the active layer of the diode element;

FIGS. 3 and 4 show in a simplified view the formation of the laser beam before, during and after shaping;

FIGS. 5 and 6 show one of the optical plate fans in a side view and in an overhead view;

FIGS. 7 and 8 show a diode laser similar to the diode laser of FIGS. 1 and 2, but with focussing optics located in the beam path following the two plate fans, consisting of a cylinder lens and spherical convex lens, the plane of the drawing of FIG. 7 being perpendicular to the active layer and the plane of the drawing of FIG. 8 being parallel to the active layer of the diode element;

FIGS. 9 and 10 show a diode laser in which the laser diode arrangement is formed by a plurality of diode elements which are stacked on top of one another in several rows perpendicular to the active layer, and with focussing optics in the beam path in front of the optical arrangement formed by the two plate fans, the plane of the drawing of FIG. 9 being perpendicular to the active layer of the diode elements and the plane of the drawing of FIG. 10 being parallel to the active layer of the diode elements.

DETAILED DESCRIPTION OF THE INVENTION

Figure 11:
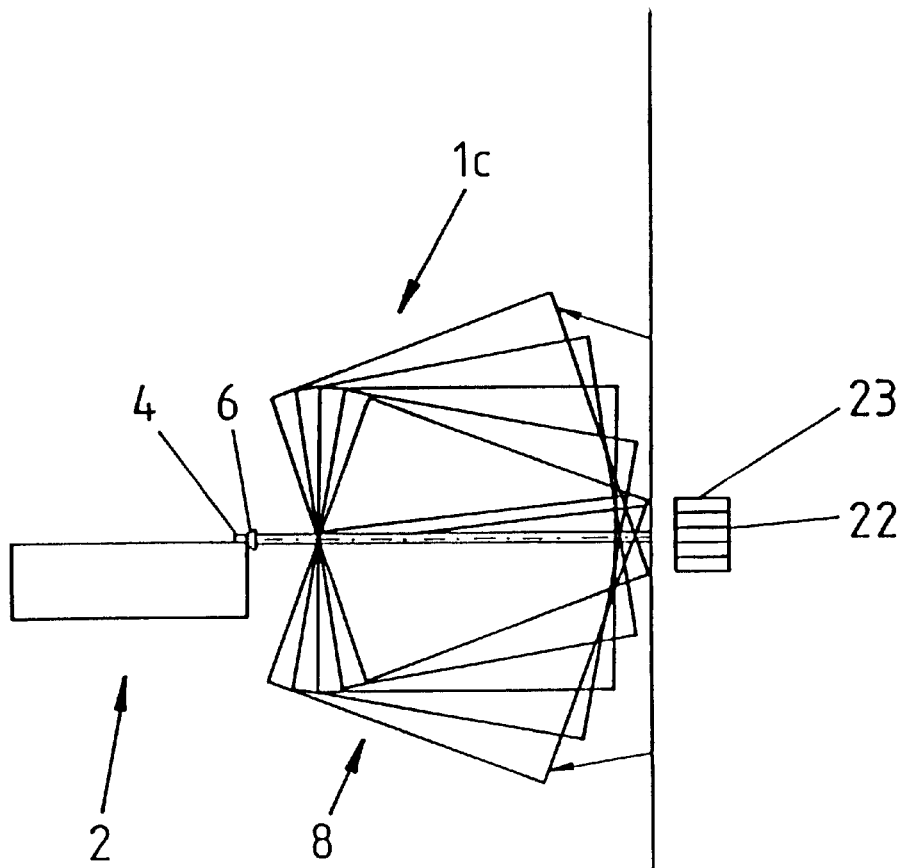
FIGS. 11 and 12 in a representation similar to FIGS. 1 and 2 show another possible embodiment in which in the beam path there are simply one plate fan and following it a stepped mirror.

Diode laser 1 shown in FIGS. 1 and 2 consists essentially of laser diode arrangement 2 which on substrate 3 made also as a heat sink among others has laser components 4 with a plurality of emitters which transmit laser light, which are oriented in the same direction and which especially also with their active layers lie in a common plane perpendicular to the plane of the drawing of FIG. 1 and parallel to the plane of the drawing of FIG. 2, i.e. in an X-Z plane which is defined by the X-axis and Z-axis given in the figures.

In the beam path of the laser radiation proceeding from laser component 4, there is fast axis collimator 6 which is formed for example by a cylinder lens which lies with its axis in the X-axis, and collimation of the laser radiation of the so-called fast axis, i.e. in the Y-axis and thus in the Y-Z plane acts perpendicular to the active layer in which the radiation of the emitters of laser component 4 has the greater divergence. After fast axis collimator 6 the laser radiation is available essentially as narrowband radiation, as is shown in FIGS. 3 through 5.

Following fast axis collimator 6 in the beam path of the laser radiation there is optical means 7 for further shaping of the laser beam, for example in such as manner that radiation (FIG. 3—position a) is first broken down or fanned out into component radiations 5' in different planes parallel to the X-Z plane which are offset against one another from plane to plane also in the X-axis (FIG. 3—position b) and these partial radiations 5' are then pushed diagonally on top of one another, as is schematically shown in FIG. 4 by 5".

Optical means 7 for this reason consists of two plate fans 8 and 9 which are made identical in the embodiment shown, in any case are arranged rotated by 90 degrees around the Z-axis on either side of an imaginary center plane which vertically intersects the Z axis, such that the two plate fans each point away from this center plane with fan side 10 which is made identically and point towards this center plane with fan side 11 which is made identically. The structure for example of plate fan 8 is detailed in FIGS. 5 and 6. Plate fan 9 is made in the same way so that the following description also applies to this plate fan.

Plate fan 8 consists of several thin plates 12 which are made of a light-guiding material, for example glass, and in the embodiment shown each have a quadratic pattern. Each plate 12 has two flat narrow plate sides 13 and 14 which form the sides for the entry and exit of the laser beams and which for this reason are optically of high quality, i.e. polished and provided with an anti-reflection layer. Two sides 13 and 14 lie opposite one another on each plate 12 and in the embodiment shown are parallel to one another. In the representation of FIGS. 5 and 6 it is assumed that plate fan 8 is formed by a total of five plates 12. Theoretically there can also be more or fewer than five plates 12.

Plates 12 with their surface sides 12' on which they are likewise polished adjoin one another in the manner of a stack, between two adjacent plates 12 at a time there being gap 15 which is filled by a medium which has an optical index of refraction which is smaller than that of the material of plates 12. Gap 15 is for example an air gap, but preferably respective gap 15 is filled with a material which joins plates 12, for example an optical cement, this connecting material in turn having an index of refraction less than that of the material of plates 12 so that total reflection within plates 12 is ensured.

Plates 12 are offset against one another in the manner of a fan. In the embodiment shown plates 12 for this reason are turned against one another around common fan axis A, in addition moreover stipulated region 16 of narrow plate side 13, especially in the embodiment shown the center of each narrow side 13 of each plate 12 lying together with corresponding areas 16 of the other plates on common axis A which lies perpendicular to the planes of surface sides 12' of plates 12 and thus also perpendicular to imaginary center plane M of plate fan 8, said plane being located parallel to these surface sides. Individual plates 12 are twisted or fanned out against one another in the manner of a fan around axis A or their regions 16 such that planes E of narrow plate sides 13 of two adjacent plates intersect in axis A and include an angle α with one another which is shown exaggerated in FIG. 5 and which for example is on the order of 1–5 degrees. Middle plate 12 with plane E of its narrow side 13 is perpendicular to longitudinal extension L or the optical axis of plate fan 8. The totality of narrow sides 13 of all plates 12 forms plate fan side 10. According to the arrangement of narrow plate sides 13, narrow plate sides 14 which in their totality form plate fan side 11 are arranged relative to one another such that planes E' of two adjacent plate sides 14 include in turn angle α with one another. Planes E and E' of narrow plate sides 13 and 14 are perpendicular to the planes of surface sides 12'.

Plate fan 8 is furthermore formed such that the plates adjacent to middle plate 12 are each turned or fanned out symmetrically, i.e. for the representation selected for FIG. 5 plates 12 provided on one narrow side of middle plate 12 are turned counterclockwise with their narrow sides 13 and the plates adjacent to the other narrow side of middle plate 12 are turned clockwise with their narrow sides 13 opposite the middle plate. The plates form light guides or waveguides for the laser light by plates 12 being made thin and due to the total reflection which the laser light undergoes within plates 12 on the their surface sides.

The width of respective gap 15 is as small as possible, but large enough (for example some 1/100 m) to ensure that for slight arches of one or more plates 12 no direct point of contact forms between two adjacent plates 12 and thus radiation losses which occur on these contact points and which could lead to reduction of the efficiency of the system are prevented.

Plate fan 8 for diode laser 1 is located such that with its longitudinal axis L it lies in the Z-axis and middle axis M in the Y-Z plane, plate fan side 10 facing laser diode arrangement 2, laser beam 5 therefore being incident in this plate fan on plate fan side 10. Plate fan 9 is positioned likewise in the Z-axis with its longitudinal axis L which is perpendicular to narrow side 13 of middle plate 12 and which intersects axis A vertically, i.e. is axially identical to axis L of plate fan 8, plate fan side 11 of plate fan 9 facing plate fan side 11 of plate fan 8. Middle plane M of plate fan 9 lies in the X-Z plane so that plate fan 9 is turned by 90 degrees around the Z axis relative to plate fan 8.

Laser beam 5 collimated by fast axis collimator 6 is incident on plate fan side 13 in the area of axis A or longitudinal axis L.

Due to the different incline of narrow plate sides 13 and plate sides 14, incident laser beam 5 is divided into different component beams 5' which emerge parallel or essentially parallel to the Z-axis on plate sides 14 from plate fan 8, component beams 5' due to refraction on narrow plate sides 13 and 14 in different planes being parallel to the X-Z plane. It goes without saying that the width of plate fan 8 in the direction of axis A and thus in the X-axis direction is equal to the width of incident radiation 5. By total reflection in plates 12 of plate fan 8 the radiation in the direction of the slow axis (X-axis) is not widened, but each component beam 5' emerges with a beam diameter which is equal to the thickness of plate 12 in this axis.

Individual component beams 5' then enter plate fan 9 on one plate side 14 at a time. Refraction on narrow plate sides 13 and 14 causes all component beams 5' to emerge on narrow sides 13 of plates 12 of plate fan 9, in the area of axis A which is parallel to the Y-axis there so that component beams 5' are arranged diagonally shifted on top of one another, as shown in FIG. 4.

FIGS. 7 and 8 show diode laser 1a which differs from diode laser 1 simply in that in the beam path following optical arrangement 7 there is slow axis collimator 17 in the form of a cylinder lens which with its axis is located parallel to the Y axis. By means of this collimator 17 the divergence of component beams 5' in the slow axis, i.e. in the X-axis, is corrected so that subsequently there are several collimated component beams 5" which are located on top of one another in the direction of the Y-axis and which are focussed by means of focussing optics, i.e. by means of spherical convex lens 18.

FIGS. 9 and 10 show diode laser 1b which differs from diode laser 1 in that instead of laser diode arrangement 2 which has several emitters next to one another only in the X-Z plane, it uses diode laser 2a which has in several X-Z planes on top of one another a plurality of laser components 4 with a plurality of emitters which with their active layer are located in this common plane. Each X-Z plane is assigned its own fast axis collimator 6. In the beam path following these fast axis collimators 6 there is optical arrangement 19 with which laser radiation 5 is focussed on first plate fan 8. This optical arrangement 19 consists of cylinder lens 20 which with its axis is parallel to the Y-axis and of another cylinder lens 21 which is located with its axis parallel to the X-axis. By this optical arrangement 19 stacking of laser components 4 is possible, although in this way laser beam 5 following fast axis collimators 6 in the direction of the Y-axis has a relatively great height. A beam height of this magnitude especially for second plate fan 9 would mean a large overall height, i.e. a plurality of plates 12, but would also mean that the laser radiation formed by component beams 5' and emerging from second plate fan 9 in the direction of the Y-axis also has a great height which requires expensive optics for further processing of the beam. This is avoided by focussing of beam 5 using optical means 19 onto first plate fan 8.

Furthermore it is also possible to apply metallic mirror layers to the surface sides of plates 12 in order to ensure total reflection within plates 12.

In diode laser 1b of FIG. 9 and 10 it is advantageous if component beams 5' are kept as small as possible when they enter plate fan 9. An arrangement would be ideal in which the focus of laser diode arrangement 2a produced by optical arrangement 19 does not lie at a common point, but has different focal points in the fast axis and slow axis direction. The beam of stacked laser diode arrangement 2a in this case then has astigmatism. The individual foci should thus be arranged as follows:

focus in the slow axis direction (in the direction of the X-axis) on the inlet side of plate fan 8;

focus in the fast axis direction (direction of the Y-axis) on the inlet side of plate fan 9.

In this focus arrangement the thicknesses of plates 12 in two plate fans 8 and 9 are minimized. Preferably the configuration is such that the divergence in front of the respective plate fan in the direction of the fast axis (Y-axis) in the focussed area is smaller (roughly by the factor of the number of plates) than in the direction of the slow axis (X-axis) in order to thus arrive at roughly the same beam quality in both axial directions.

Figure 12:
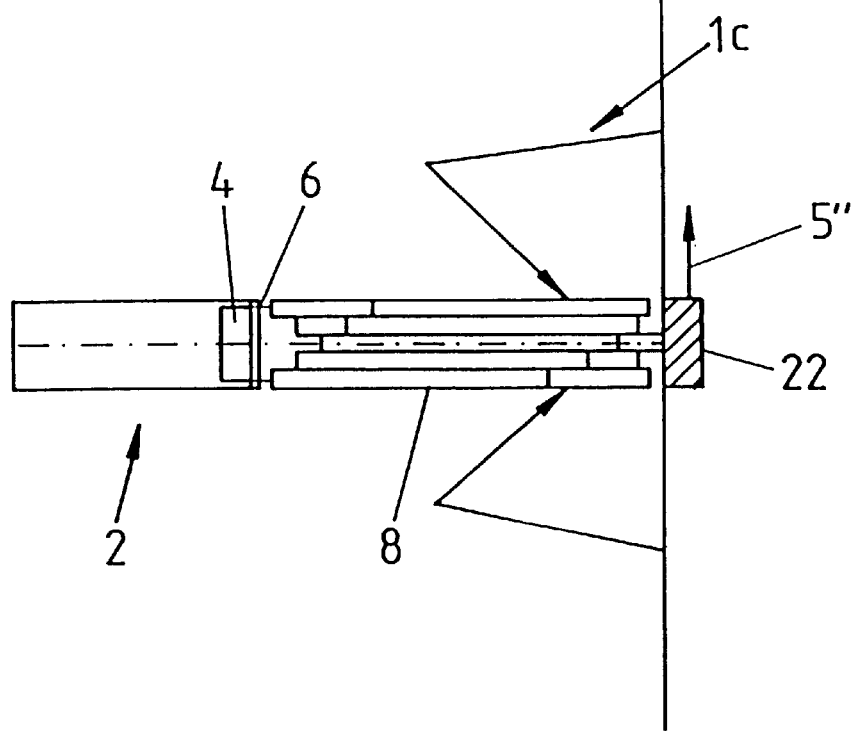

FIGS. 11 and 12 show as additional embodiments diode laser 1c which differs from diode laser 1 of FIGS. 1 and 2 only in that instead of plate fan 9 which is the second one in the beam path, for diagonally pushing the bundle of component beams 5' together (position b in FIG. 3) into the bundle of component beams 5" (FIG. 4) there is so-called stepped mirror 22 which has a plurality of mirror surfaces 23 which are offset against one another in the manner of steps, such that reshaping the bundle of component beams 5' into the bundle of component beams 5" takes place by reflection on the mirror surfaces.

The invention was described above using embodiments. It goes without saying that numerous changes and modifications are possible without departing from the inventive idea underlying the invention. Thus it is also possible for example to coat plates 12 additionally on their surface sides with a material which has an optical index of refraction which is less than that of the material of plates 12 in order to thus improve the waveguide effect or the total reflection within the plates. Furthermore, there is of course the possibility of using stepped mirror 22 instead of plate fan 9 in diode lasers 1a and 1b.

It was assumed above that plates 12 of plate fans 8 and 9 are each twisted against one another around common fan axis A which lies in the plane of narrow plate side 13. Here other embodiments are also conceivable, for example the plates of the plate fans can also be twisted against one another in the manner of a fan around several parallel axes A, that is, two plates at a time around one axis. Furthermore, the location of the axis or axes can be chosen differently than described above. The axis or axes can also be located outside of the planes of plate sides 13.

Thus, in the aforementioned description, to simplify understanding it was assumed that for plate fan 9 which is the second in the beam path, sides 13 (beam inlet side) of all plates 12 are twisted against one another around common axis A (corresponding to point 16) and the planes of these plate sides 13 intersect in common axis A. This is in fact unnecessary in second plate fan 9. It is necessary that the planes of plate sides 13 include the stipulated angles with one another. Plates 13 however can be shifted against one another in the plane of their surface sides, i.e. in the view chosen for FIG. 2 in the X-Z plane.

It is furthermore possible to adjust or set plates 12 of first plate fan 8 relative to one another in the plane of their surface sides, i.e. in the embodiment shown in FIG. 1 in the Y-Z plane, and in doing so especially in the beam axis (Z-axis of FIGS. 1 and 2—double arrow) of FIG. 1) by displacement such that for the beams through all plates 12 up to focussing the same path lengths or transit times arise in order to thus achieve optimum beam focussing. After this calibration, plates 12 of plate fan 8 are then securely joined to one another. In this case then the planes of all plate sides 13 of first plate fan 8 likewise do not intersect in common axis A (corresponding to point 16), but in several parallel axes.

REFERENCE NUMBER LIST 1, 1a, 1b, 1c diode laser
2, 2a laser diode arrangement
3 substrate
4 laser component
5 strip-shaped laser beam
5' component beam
6 fast axis collimator
7 optical arrangement
8, 9 plate fan
10, 11 plate fan side
12 plate
13, 14 plate side
15 gap
16 point
17 slow axis collimator
18 convex lens
19 focussing optics
20, 21 cylinder lens
22 step mirror
23 mirror surface

What is claimed is:

1. Laser optics for shaping at least one laser beam which has a linear or strip-shaped cross section which extends in a first axial direction (X-axis) perpendicular to the beam axis (Z-axis), with at least two optical shaping elements located in succession in a beam path, wherein at least one of said optical shaping elements is an element through which said at least one laser beam has passed, and which form optical arrangement, in which at least one laser beam is fanned out in one plane (Y-Z plane) perpendicular to a first axis (X-axis) into several parallel component beams which are offset against one another both in said first axial direction (X-axis) and in a second axial direction (Y-axis) which is perpendicular to said beam axis (Z-axis) and perpendicular to said first axis (X-axis), and in which then fanned-out component beams are combined, wherein:

a second optical shaping element causes a shift of said component beams formed in said first optical shaping element each in one plane (X-Z plane) parallel to said first axis (X-axis) such that in said laser beam emerging from said second optical element parallel component beams are pushed on top of one another and are offset against one another in said second axis (Y-axis) and wherein at least one of said at least two optical shaping elements is a plate fan which comprises a plurality of plates of a light-guiding material which are offset in a direction perpendicular to their surface sides and in which each of said plurality of plates forms a first flat narrow plate side and opposite a latter second flat narrow plate side, said first flat narrow plate side and said latter second flat narrow plate side of each said plate are parallel to one another, said first and second narrow flat plate sides are twisted against one another in a manner of a fan such that said first flat narrow plate side of each said plate lies in one plane (E) which includes an angle ($\alpha$) with a plane of said first flat narrow plate side of each said adjacent plate, said first narrow flat plate sides in their totality form a first plate fan side and said second narrow flat plate sides in their totality form a second plate fan side for entry and exit respectively of at least one laser beam which passes through said plate fan, planes (E) of said first and second narrow flat plate sides and at least one fan axis (A) are perpendicular to surface sides of said plurality of plates.

2. Laser optics as claimed in claim 1, wherein said plurality of plates are stacked in succession perpendicular to their surface sides.

3. Laser optics as claimed in claim 1, wherein said planes (E) of said first narrow flat plate sides are twisted against one another around said at least one fan axis (A).

4. Laser optics as claimed in claim 3, wherein said planes (E) of said first narrow flat plate sides are twisted against one another around one common fan axis (A).

5. Laser optics as claimed in claim 3, wherein said planes (E) of said first narrow flat plate sides are offset against one another around at least two fan axes (A).

6. Laser optics as claimed in claim 1, wherein said first shaping element is a plate fan which with planes of surface sides of said plurality of plates is parallel to a plane (Y-Z plane) defined by said beam axis (Z-axis) and said second axis (Y-axis) and with said at least one fan axis (A) being parallel to said first axis (X-axis).

7. Laser optics as claimed in claim 6, wherein said first and second shaping elements are first and second plate fans, and wherein said first and second plate fans are turned against one another by 90° around said beam axis (Z-axis), such that said first plate fan which forms said first optical shaping element with planes of surface sides of said plurality of plates is perpendicular to planes of surface sides of said plurality of plates of said second plate fan.

8. Laser optics as claimed in claim 7, wherein said first and second fans are facing one another on a second plate fan side.

9. Laser optics as claimed in claim 1, wherein said second shaping element is a plate fan which with said planes of surface sides of said plurality of plates is parallel to a plane (X-Z plane) defined by said beam axis (Z-axis) and said first axis (X-axis) and with said at least one fan axis (A) being parallel to said second axis (Y-axis).

10. Laser optics as claimed in claim 1, wherein said at least one fan axis (A) touches a first narrow side of said at least one plate.

11. Laser optics as claimed in claim 1, wherein first and second plate fan planes (E) of said first narrow flat plate side each include the same angle with one another.

12. Laser optics as claimed in claim 1, wherein for plate fans proceeding from an outside plate, a first narrow plate side or a projection onto a plane parallel to a surface side, are each twisted opposite one another in a same direction.

13. Laser optics as claimed in claim 1, wherein to achieve total reflection within each plate on surface sides of said each plate, adjacent to each surface side there is a medium which has an index of refraction which is smaller than that of a material of the plate.

14. Laser optics as claimed in claim 13, wherein between two adjacent plates there is a cement with an optical index of refraction smaller than that of the material of said adjacent plates.

15. Laser optics as claimed in claim 14, wherein for at least two plate fans located in succession in said beam path, a first plate fan which follows a laser diode arrangement in said beam path with planes of surface sides of said plurality of plates is perpendicular to a plane of an active layer and a second plate flan which follows said laser diode arrangement in said beam path with planes of surface sides of said plurality plates is parallel to said plane of said active layer.

16. Laser optics as claimed in claim 1, wherein there is an air gap between two adjacent plates.

17. Laser optics as claimed in claim 1, wherein said plurality of plates are mirrored on their surface sides.

18. Laser optics as claimed in claim 1, wherein when using at least one laser diode arrangement as a radiation source which has at least one laser component with several emitters which emit laser light and which are offset against one another in said first axial direction (X-axis) and which are located with an active layer in a common plane (X-Z plane) which encloses said first axial direction (X-axis), said plate fan which forms said first shaping element lies with planes of surface sides of said plurality of plates perpendicular to a plane of an active layer.

19. Laser optics as claimed in claim 1, wherein when using at least one laser diode arrangement as a radiation source which has at least one laser component with several emitters which emit laser light and which are offset against one another in said first axial direction (X-axis) and which are located with an active layer in a common plane (X-axis), said plate fan which forms said second shaping element lies with planes of surface sides of said plurality of plates parallel to a plane of an active layer.

20. Laser optics as claimed in claim 1, wherein there is at least on other optical arrangement which shapes said beam, said optical arrangement is a focusing arrangement or collimator in said beam path.

21. Laser optics as claimed in claim 1, wherein in said beam path in front of an optical arrangement formed by said first and second shaping elements there is a second arrangement which shapes the beam, said second arrangement is at least one collimator or focusing means.

22. Laser optics as claimed in claim 1, wherein when using a laser diode arrangement with laser components located on top of one another in several planes in one axial direction (Y-axis) perpendicular to an active layer, between said laser diode arrangement and an optical arrangement formed by first and second shaping elements there are focusing optics which focus said laser beams.

23. Laser optics as claimed in claim 22, wherein said focusing optics focus said laser beam in the region of said first and second shaping elements or in a region of optical arrangement which is formed by said first and second shaping elements.

24. Laser optics as claimed in claim 23, wherein said focusing optics with astigmatism, focus said laser beam into a first plane, (X-Z plane), defined by said first axis (X-axis) and beam axis (Z-axis) and on a region following in said beam direction (Z-axis) in a second plane which is perpendicular to said first plane, (Y-Z plane) defined by said second axis (Y-axis) and said beam axis (Z-axis).

25. Laser optics as claimed in claim 24, wherein said focusing optics focus said laser beam in said first plane (X-Z plane) onto a first inlet surface of said first shaping element and in said second plane (Y-Z plane) onto a second inlet surface of second shaping element.

26. Laser optics as claimed in claim 1, wherein at least one of said first and second shaping elements, made as fan plates, are set or adjusted relative to one another to achieve the same transmit times or path lengths of said beams guided by different plates at least in said beam direction.

27. Laser optics as claimed in claim 1, wherein said plurality of plates of said plate fans form the first and second shaping elements to guide said beam by total reflection.

28. Laser optics as claimed in claim 1, wherein said first optical shaping element causes fanning out of at least one laser beam in said plane (Y-Z plane) perpendicular to said first axis (X-axis).

29. A diode laser having laser optics as claimed in claim 1, with at least one laser diode arrangement as the radiation source, which comprises at least one laser component with several emitters which emit laser light and which are offset against one another in a first axial direction (X-axis) and which are located with their active layer in a common plane (X-Z plane) which encloses said first axial direction (X-axis), and with laser optics with at least one optical arrangement for shaping a laser beam which is located in a common laser beam of said emitters.

* * * * *